United States Patent
Atmur

(10) Patent No.: US 7,348,755 B2
(45) Date of Patent: Mar. 25, 2008

(54) TIME SLICED DSP OPERATION FOR VERY HIGH FREQUENCY PULSE WIDTH MODULATED CONTROLLERS

(75) Inventor: Robert J. Atmur, Whittier, CA (US)

(73) Assignee: The Boeing Company, Chicago, IL (US)

( * ) Notice: Subject to any disclaimer, the term of this patent is extended or adjusted under 35 U.S.C. 154(b) by 879 days.

(21) Appl. No.: 10/740,737

(22) Filed: Dec. 18, 2003

(65) Prior Publication Data

US 2005/0135474 A1    Jun. 23, 2005

(51) Int. Cl.
*H02P 27/04* (2006.01)
(52) U.S. Cl. .................. 318/801; 318/811; 318/800; 318/807; 363/56
(58) Field of Classification Search .......... 363/56.02, 363/98, 132; 318/811, 800, 807, 80
See application file for complete search history.

(56) References Cited

U.S. PATENT DOCUMENTS

| | | | |
|---|---|---|---|
| 5,291,194 A | | 3/1994 | Ames |
| 5,491,622 A | * | 2/1996 | Carosa .................... 363/56.02 |
| 5,646,366 A | | 7/1997 | O'Connell |
| 5,748,102 A | | 5/1998 | Barron |
| 6,185,118 B1 | * | 2/2001 | Sander et al. ............... 363/132 |
| 6,331,759 B1 | | 12/2001 | Atmur |
| 6,482,054 B2 | | 11/2002 | Treaster et al. |
| 6,536,365 B1 | | 3/2003 | Horton |
| 6,580,627 B2 | * | 6/2003 | Toshio .......................... 363/98 |
| 6,600,695 B1 | | 7/2003 | Nugent et al. |
| 6,642,683 B1 | | 11/2003 | Atmur |
| 2003/0001538 A1 | | 1/2003 | Atmur |
| 2003/0103771 A1 | | 6/2003 | Atmur et al. |
| 2003/0218438 A1 | | 11/2003 | Atmur |

OTHER PUBLICATIONS

Helduser, S., and Bonefeld, R., *Active Damping in Civil Engineering Using Hydraulic Actuators*, Institute of Fluid Power and Motion Control, Dresden University of Technology, Germany, 2001.

(Continued)

*Primary Examiner*—Karen Masih
(74) *Attorney, Agent, or Firm*—Ingrassia, Fisher & Lorenz, P.C.

(57) ABSTRACT

Methods and apparatus are provided for frequency scaling the PWM signal output of a controller/driver for an electrical device such as a BLDC motor. The apparatus comprises a number of multiple half-bridge assemblies, with each multiple half-bridge assembly connected to a respective phase winding of the motor. Each individual half-bridge assembly is operated within the frequency limit of its internal switching elements, but the composite output frequency of each multiple half-bridge assembly can be the product of the switching element frequency and the number of individual half-bridge assemblies in the multiple half-bridge assembly. High-speed torque loop control is implemented by synchronizing multiple DSP's with overlapping interrupts, so that the output pulse width of the PWM signal can be adjusted on a pulse-to-pulse basis. Moreover, the frequency scaling and pulse-to-pulse control processes can be achieved with standard off-the-shelf devices.

11 Claims, 8 Drawing Sheets

OTHER PUBLICATIONS

Stekl, Petr, and Kubiczek, Zdenek, *Low-Cost, 3-Phase, AC Motor Control System with Power Factor Correction Based on MC68HC908MR32*, Motorola Czech System Application Laboratory, Roznov pod Radhostem, Czech Republic, 2001.

De Mendonca, R.G., Neto, L. Martins, Camacho, J.R., *The Oscillating Torque On A Three-Phase Induction Generator Connected To A Single-Phase Distribution System*, Electrical Machines Laboratory, Electrical Engineering Department Universidade Federal de Uberlandia, Brazil, 2001.

Visinka, Radim, *Low Cost 3-Phase AC Motor Control System Based on MC68HC908MR24*, Roznov System Application Laboratory, Motorola, Czech Republic, 1998.

Brushless DC (BLDC) Motor, [online]. Retrieved from Internet: <URL: www.motorola.com/webapp/sps/site/overview>, Nov. 18, 2003.

3-Phase AC Induction Motor, [online], Retrieved from Internet: <URL: www.motorola.com/webapp/sps/site/overview>, Nov. 18, 2003.

\* cited by examiner

US 7,348,755 B2

TIME SLICED DSP OPERATION FOR VERY HIGH FREQUENCY PULSE WIDTH MODULATED CONTROLLERS

TECHNICAL FIELD

The present invention generally relates to pulse-width-modulated (PWM) controllers, and more particularly relates to very high frequency PWM controllers.

BACKGROUND

Pulse-width-modulated (PWM) controllers are frequently used to control electrical devices such as various types of motors. For example, one type of motor often controlled by a PWM drive system is the brushless direct current (BLDC) motor. In the case of poly-phase BLDC motors, such as a three-phase BLDC motor, the controller/driver is typically configured with half-bridge assemblies connected to respective phase windings of the BLDC motor.

The speed of a BLDC motor is generally controlled by a PWM driver, where the average currents in the phase windings are typically generated by the "on" and "off" states of the PWM input voltage signals. That is, the duty cycle of the input voltage pulse signals can be used as a controlling factor for the average current in the phase windings, in order to determine the speed of the motor.

The upper speed capability of a conventional PWM motor driver is typically limited to the maximum frequency capability of the switching elements in the half-bridge circuits used to drive the phase windings of the motor. For example, a standard driver with insulated gate bipolar transistor (IGBT) switching elements can typically drive a three-phase motor with a maximum switching frequency of approximately 20 kHz, assuming the maximum IGBT current is not required for more than a few minutes. As such, conventional motor drivers using IGBT switching elements are generally limited to frequency applications up to 20 kHz. While other types of devices commonly used as switching elements, such as the field effect transistor (FET), are capable of operating at higher frequencies, the power capability of a FET is generally limited by its maximum voltage range of approximately 200 volts. Other types of switching devices with higher frequency and power capabilities may be available, but their cost is typically many times higher than the cost of a standard component, such as an IGBT. As such, the costly high frequency, high power devices are generally considered undesirable for production applications.

Current trends in motor design include ever increasing requirements for combinations of high power and high frequency driver capabilities. For example, one recent application specified a motor controller capable of operating at a frequency of approximately 125 kHz, and at a power level requiring IGBT capability. Therefore, there is a need for a frequency scalable type of driver to operate at relatively high frequencies, and over a range of power levels. Moreover, this type of scalable driver could be suitable for production applications if it were configured with standard low-cost components.

Accordingly, it is desirable to provide a controller/driver for BLDC and other motor applications with scalable frequency capabilities over a range of power levels. In addition, it is desirable to implement the scalable driver with low-cost components for production applications. Furthermore, other desirable features and characteristics of the present invention will become apparent from the subsequent detailed description and the appended claims, taken in conjunction with the accompanying drawings and the foregoing technical field and background.

BRIEF SUMMARY

According to various exemplary embodiments, devices and methods are provided for frequency scaling a controller/driver for an electrical device such as a BLDC motor. One exemplary method uses multiple half-bridge assemblies connected to each phase winding of the motor. The individual half-bridge assemblies within a multiple half-bridge assembly are sequentially activated to generate a pulse-width-modulated output signal to a respective phase winding at a composite frequency greater than the operating frequency of an individual half-bridge assembly. Typically, the composite frequency is equal to the product of the operating frequency of an individual half-bridge assembly and the number of half-bridge assemblies connected to a respective phase winding. Torque loop control is implemented by sampling the current in the respective phase windings on a pulse-to-pulse basis, and adjusting the output signal pulse width on a pulse-to-pulse basis to maintain a predetermined level of current in the phase windings.

One exemplary embodiment of a controller/driver for a motor includes multiple half-bridge assemblies connected to respective phase windings of the motor. Each multiple half-bridge assembly includes a predetermined number of individual half-bridge assemblies, with each individual half-bridge assembly having switching elements capable of operating at a predetermined frequency. The individual half-bridge assembly switching elements are operated by time sliced commands generated in a processor, such that each multiple half-bridge assembly generates pulse-width-modulated output signals into a respective phase winding at a composite frequency that is typically equal to the product of the individual switching element frequency and the number of individual half-bridge assemblies connected to a respective phase winding.

The processor is configured to control the operation of the switching elements in the individual half-bridge assemblies on a pulse-to-pulse basis. To achieve pulse-to-pulse control in a relatively high-speed controller/driver (e.g., at a frequency of 120 kHz), the processor can incorporate multiple digital signal processors (DSP's) in a synchronized overlapping manner. As such, the combined DSP output signal frequency can be greater than the processing frequency of an individual digital signal processor. In general, the combined DSP output signal frequency is the product of the number of independently interrupted digital signal processors and the processing frequency of an individual digital signal processor.

As a result of combining the capabilities of half-bridge assemblies and DSP's in the manner described above, high frequency controller/drivers can be implemented with standard low-cost devices, making the exemplary controller/drivers suitable for production applications. Moreover, torque loop control of the PWM signal can be implemented on a pulse-to-pulse basis.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention pertain to the area of scaling the frequency capabilities of controller/drivers for electrical devices, such as a BLDC motor. Combining multiple configurations of half-bridge assemblies in a controller/driver enables the composite output frequency of the controller/driver to exceed the limitations of the individual components used in the controller/driver half-bridge assemblies. In addition, multiple digital signal processor elements can be configured to control the controller/driver half-bridge assemblies at a pulse rate greater than the speed of an individual digital signal processor. As such, the frequency scalability of the controller/driver can be achieved with standard low-cost components.

Figure 1:
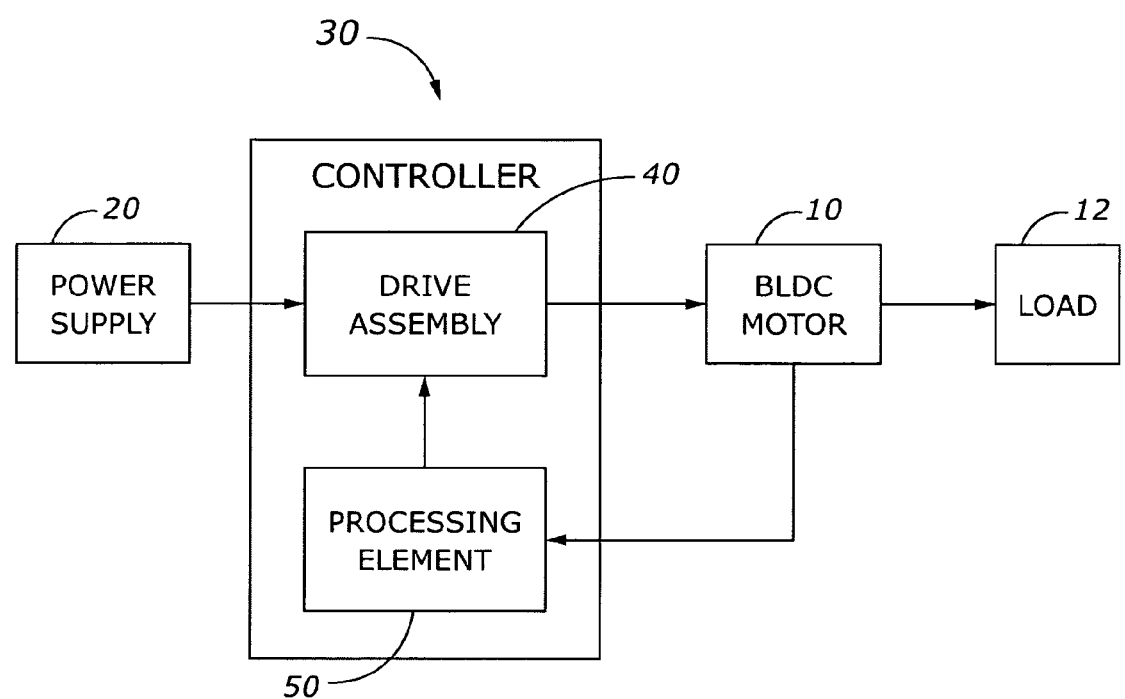
FIG. 1 is a block diagram of an exemplary control system for a BLDC motor.

According to an exemplary embodiment of a system for controlling a BLDC motor 10 connected to a load 12, as shown in FIG. 1, a controller 30 provides drive signals to motor 10 and receives feedback signals from motor 10. Controller 30 includes a drive assembly 40 in electrical communication with a processing element 50, which may be any type of microprocessor, micro-controller, or other computing device capable of executing instructions in any computing language. A conventional power supply 20 provides power for the various components of controller 30.

Drive assembly 40 typically receives DC power from power supply 20, and is generally configured to produce pulse-width-modulated (PWM) output signals to BLDC motor 10. The PWM signals typically develop an average current relationship in the phase windings of BLDC motor 10. In order to maintain an appropriate PWM input to BLDC motor 10, processing element 50 typically receives feedback from BLDC motor 10, such as the measured current in the phase windings, in addition to other parameters.

Figure 2:
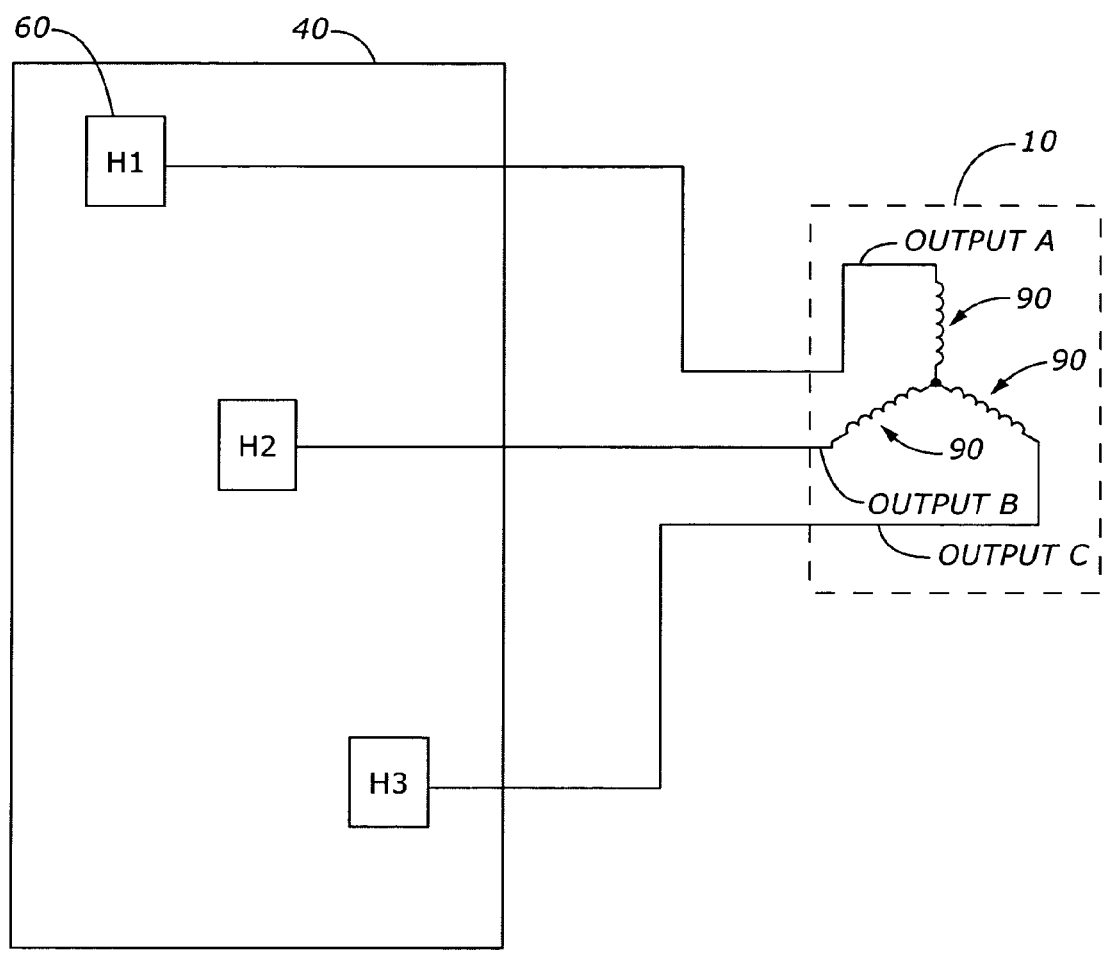
FIG. 2 is a block diagram of a conventional exemplary drive assembly for a BLDC motor.

An exemplary embodiment of a conventional driver configuration is shown in FIG. 2. In this embodiment, BLDC motor 10 is configured as a three-phase motor, with phase windings 90 corresponding to each phase. However, BLDC motor 10 can be configured with any number of phases and corresponding phase windings in a wide range of alternate but equivalent embodiments.

Drive assembly 40 is shown in FIG. 2 with one half-bridge assembly 60 electrically connected to each respective phase winding 90 of BLDC motor 10. That is, half-bridge drive assembly 60 H1 generates a PWM output signal to output A, half-bridge drive assembly 60 H2 generates a PWM output signal to output B, and half-bridge drive assembly 60 H3 generates a PWM output signal to output C. In this type of standard configuration, the maximum output frequency of each half-bridge assembly 60 is generally limited to the maximum speed of the switching elements used in the half-bridge assembly. As such, a conventional driver using IGBT's for switching elements will generally be limited to an output frequency of approximately 20 kHz, as previously noted.

Figure 3:
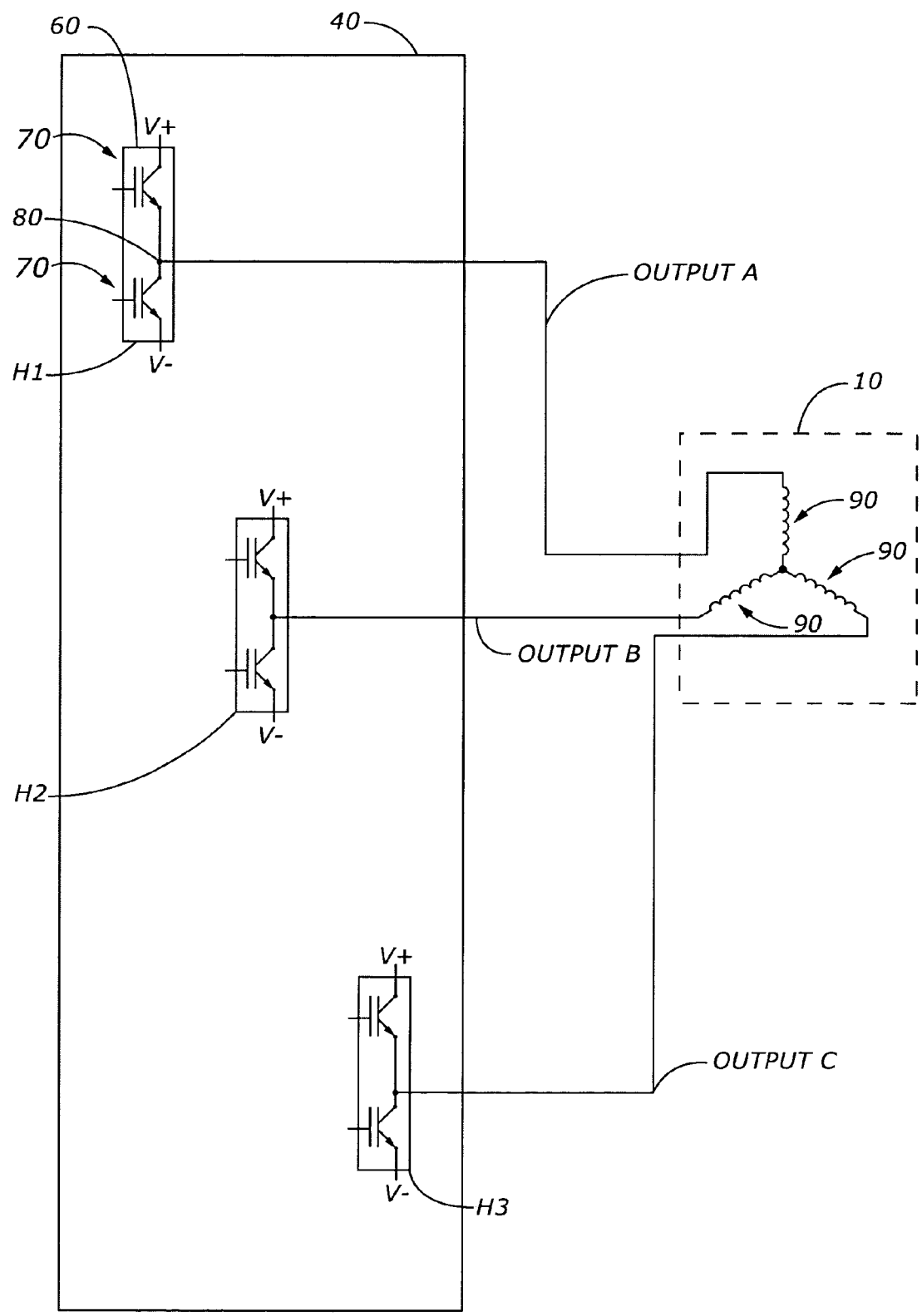
FIG. 3 is a schematic diagram of the conventional exemplary drive assembly of FIG. 2.

The conventional driver configuration of FIG. 2 is shown schematically in FIG. 3. In this exemplary embodiment, each half-bridge assembly 60 includes two switching elements 70 connected in series, with a node 80 between the switching elements. Insulated gate bipolar transistors (IGBT's) are typically used as switching elements in this type of application, and are generally available at a relatively low cost. As indicated in FIG. 3, the collector and emitter of each IGBT switching element 70 are electrically connected to power supply 20 (FIG. 1), and the gate of each IGBT is electrically connected to processing element 50 (FIG. 1). In addition, each half-bridge assembly 60 of FIG. 3 can further include any one of a number of other electrical components. For example, each switching element 70 of each half-bridge assembly 60 can be electrically connected to a fast recovery epitaxial diode (FRED).

Each switching element 70 can operate at a frequency that does not exceed a predetermined maximum switching frequency, which is typically based on a maximum allowable power dissipation value for switching element 70. For example, when the switching elements are based upon IGBT's, each switching element is typically limited to a maximum operating frequency of approximately 20 kHz.

Figure 4:
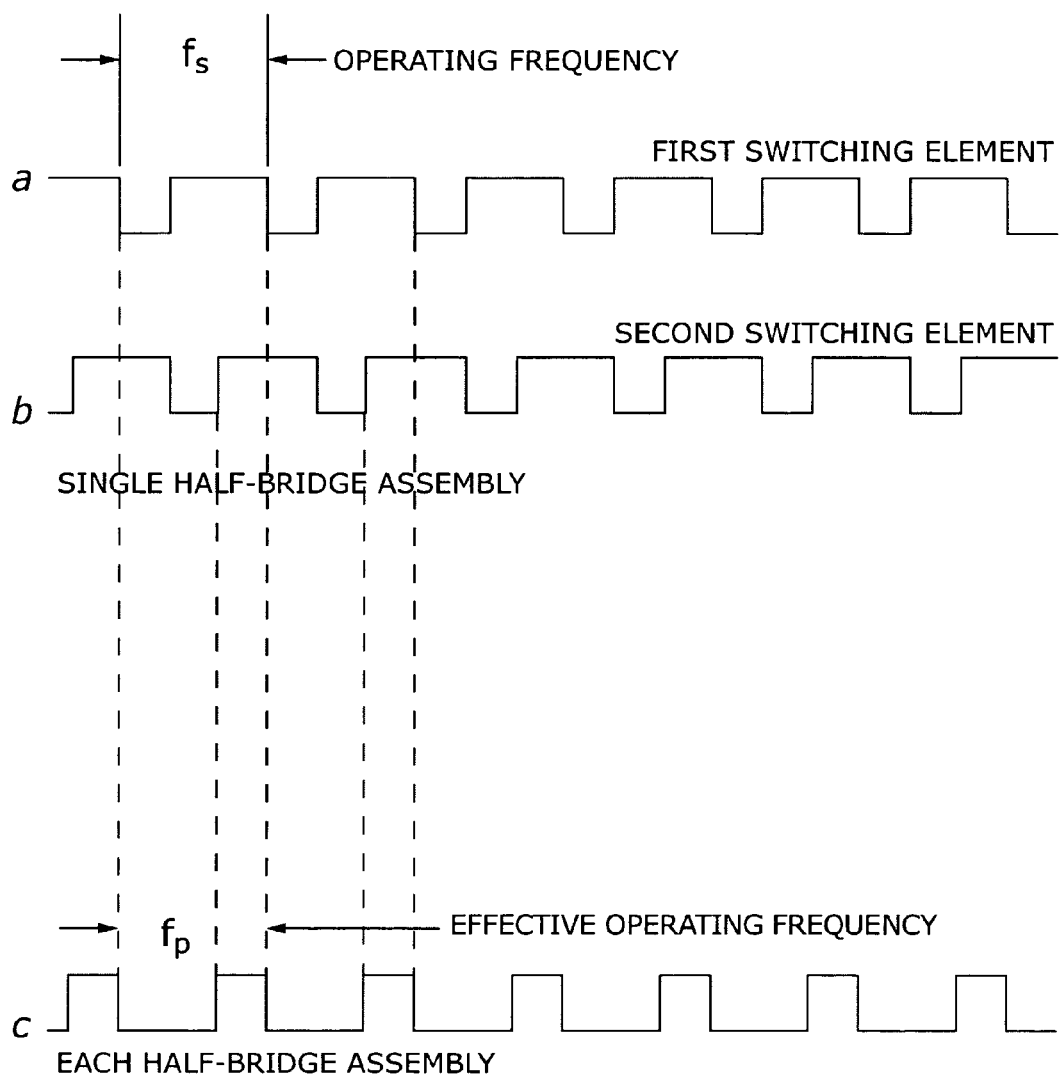
FIG. 4 is a timing diagram for the exemplary switching element configuration of FIG. 3.

FIG. 4 illustrates a timing diagram of the two switching elements 70 of a single half-bridge assembly 60 connected to a respective phase winding 90 of a conventional three-phase BLDC motor 10, with each switching element 70 operating at a frequency $f_s$. As illustrated, the first and second switching elements 70 are typically operated in the 'on' and 'off' states during the same frequency period ($f_s$), with the second switching element switched in a staggered manner with respect to the first switching element, as shown in timing diagrams a and b. Thus, each half-bridge assembly 60 is generally capable of providing a PWM output to its respective phase winding 90, as shown in timing diagram c, at a frequency $f_p$, that does not exceed, and is generally equal to, the operating frequency $f_s$ of each switching element 70.

Figure 5:
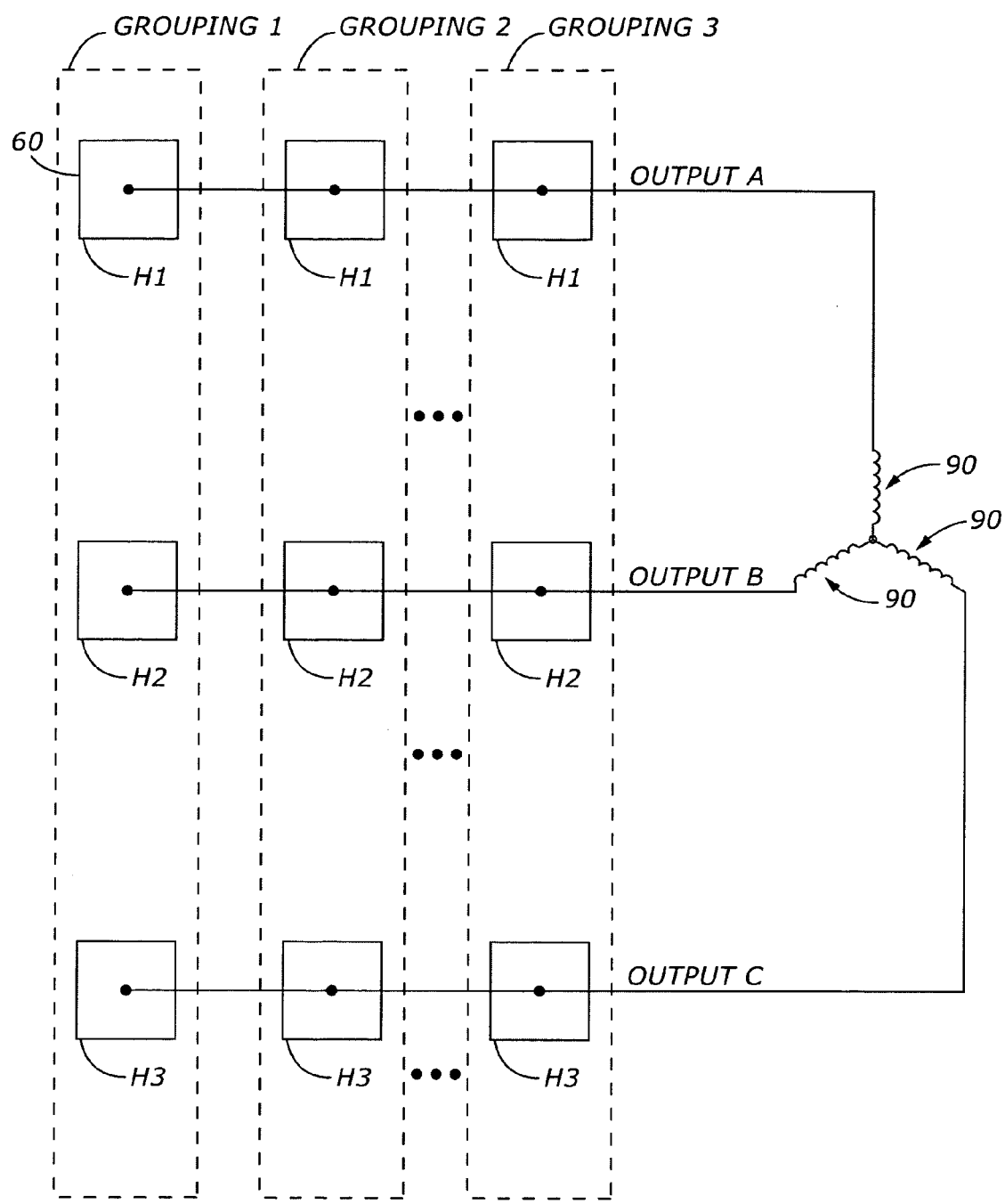
FIG. 5 is a block diagram of an exemplary configuration for a frequency scaled BLDC motor drive assembly.

In order to generate a drive assembly output PWM signal at a frequency higher than the operating frequency of an individual switching element (i.e., frequency scaling), multiple half-bridge drive assemblies can be configured in groupings, as illustrated in the block diagram of FIG. 5. In this exemplary embodiment, each half-bridge assembly 60 connected to the same output (A, B or C) belongs to a different grouping. That is, the H-1 assemblies are all connected to output A, but are each configured within a different grouping (1, 2, . . . n). In similar fashion, all H-2 assemblies are connected to output B, and all H-3 assemblies are connected to output C. This same configuration is shown schematically in FIG. 6, where each half-bridge assembly 60 includes two switching elements 70 connected in the same manner as previously described for the configuration of FIG. 3.

Figure 6:
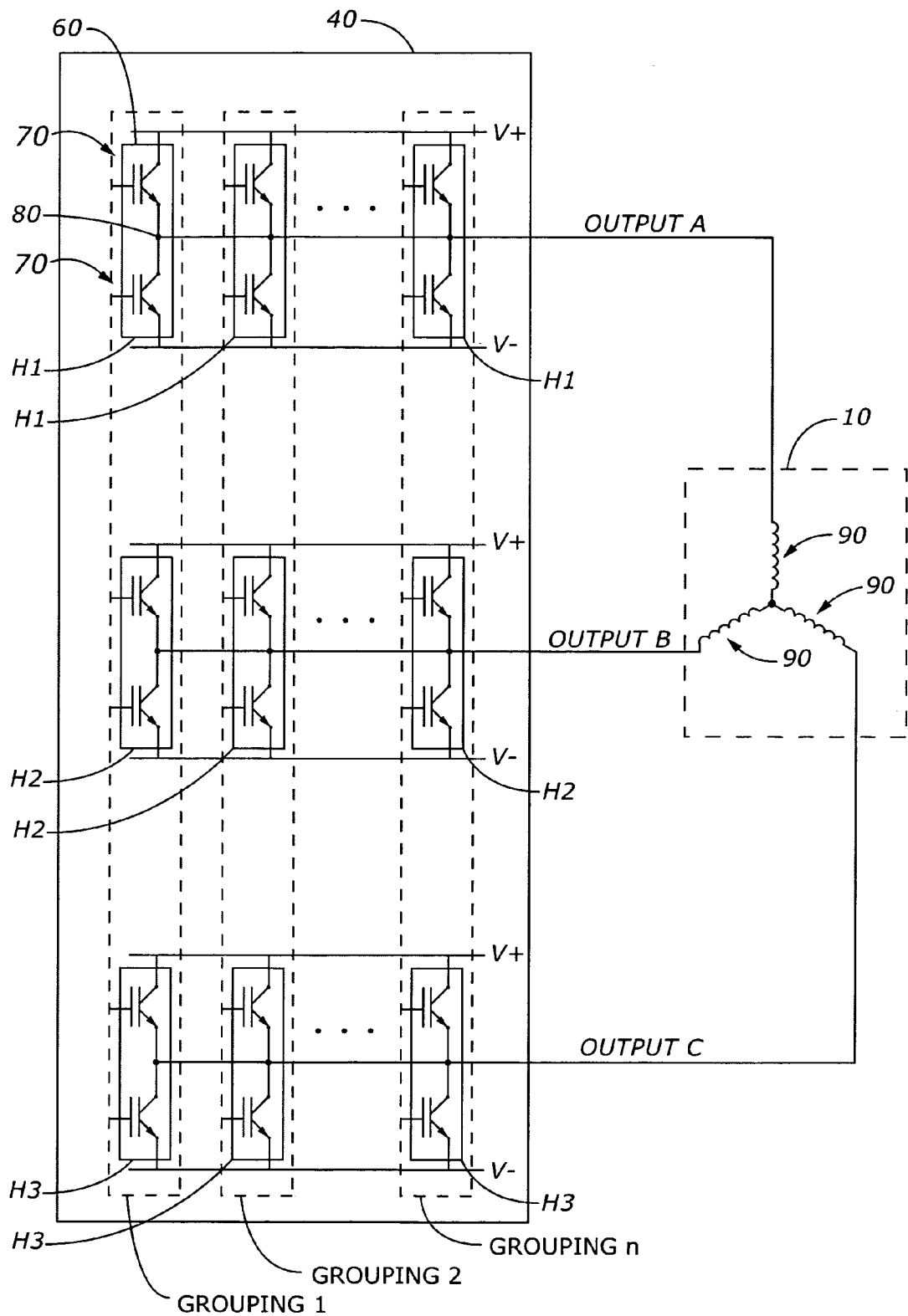
FIG. 6 is a schematic diagram of the exemplary configuration of FIG. 5.
Figure 7:
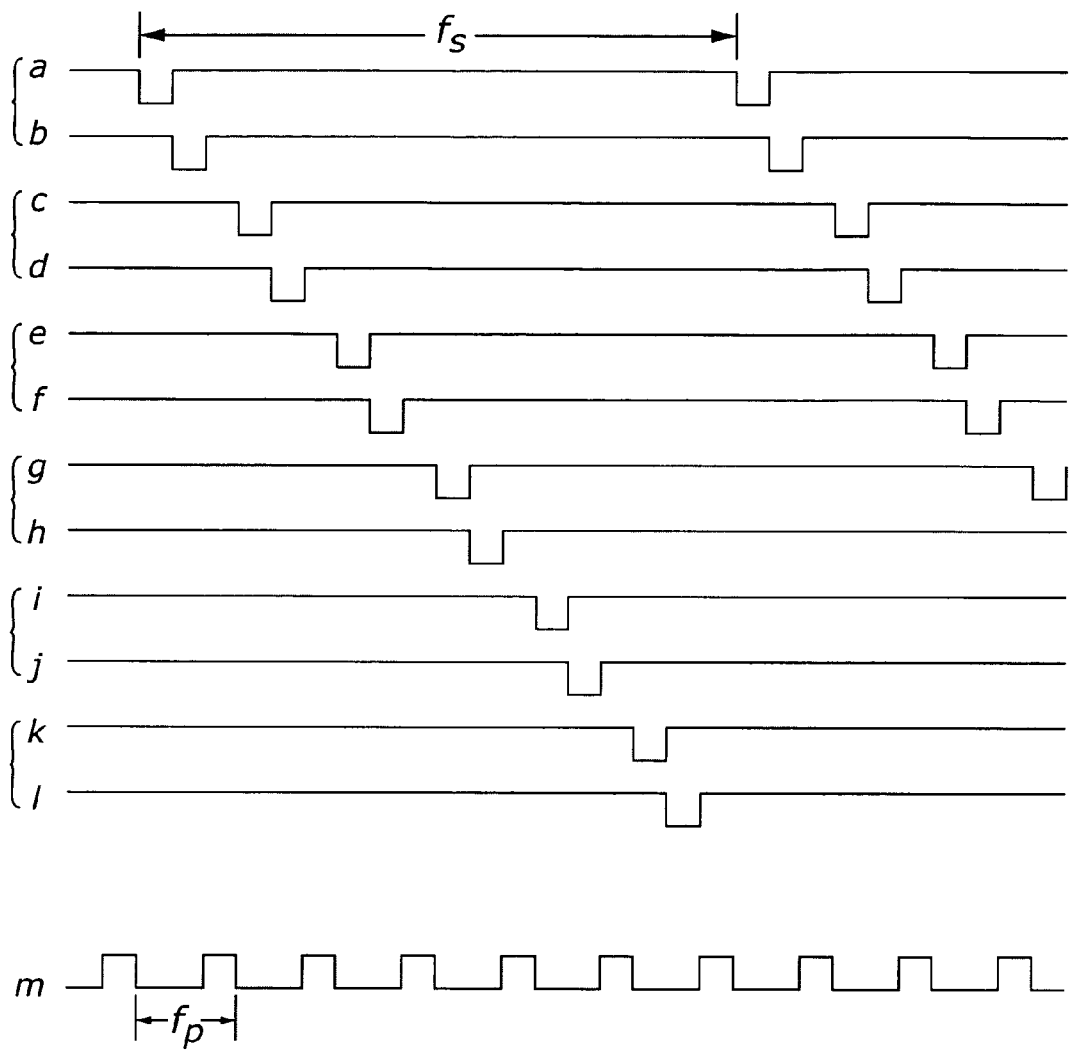
FIG. 7 is a timing diagram for an exemplary configuration of a frequency scaled BLDC motor drive assembly.

The frequency scaling operation of a drive assembly configured in the manner of FIG. 6 is illustrated in the timing diagrams of FIG. 7. In this exemplary embodiment, the number n of half-bridge assembly groupings is selected as six, in order to achieve a desired level of frequency scaling.

The first and second switching elements 70 of each half-bridge assembly 60 connected to the same phase winding 90 (e.g., the six H1 assemblies connected to Output A) are designated in FIG. 7 as a/b, c/d, e/f, g/h, i/j, and k/l, respectively. Each pair of first and second switching elements 70 are operated in the same manner as previously described for a single half-bridge assembly 60 in FIG. 4, where $f_s$ is the operating frequency of each switching element 70. However, in this exemplary embodiment, the switching element pairs of each half-bridge assembly connected to the same phase winding are staggered in time, as indicated in timing diagrams a through 1. For example, switching element pair c/d is time staggered with respect to switching element pair a/b, switching element pair e/f is time staggered with respect to switching element pair c/d, and so on. As a result, the composite output frequency $f_p$, as shown in timing diagram m, generated from the combination of six half-bridge assemblies 60 being connected to a single phase winding 90, is generally equal to $n \times f_s$, or in this embodiment, $f_p = 6 \times f_s$. Therefore, if IGBT's are used as switching elements for this exemplary embodiment of six groupings, a maximum frequency of approximately $(6 \times 20)=120$ kHz can be achieved.

The various examples disclosed herein are merely illustrative of various methods of arranging the half-bridge assemblies. In this regard, the half-bridge assemblies can be physically located in any one of a number of different manners with respect to one another. Moreover, various multiple half-bridge assembly configurations are available commercially, such as the model 4357 3-phase motor drive including three half-bridge assemblies, manufactured by M. S. Kennedy Corp. of Liverpool, N.Y.

The previously described drive assembly configuration of FIG. 6 has been shown in the timing diagrams of FIG. 7 to be capable of achieving a PWM output signal of approximately 120 kHz, assuming IGBT switching elements are used in the multiple half-bridge assemblies. For motor drive applications, however, as in the case of BLDC motors, the torque loop control is generally optimal when the loop control works on a pulse-to-pulse basis. That is, the time needed for sampling a motor parameter (e.g., current in a phase winding) and for adjusting the subsequent driver pulse widths accordingly, should ideally be no more than the time interval between output pulses. For the exemplary embodiment described above, with a PWM output frequency of approximately 120 kHz, the pulse-to-pulse time interval is in the range of about 8 microseconds. As such, a driver processor, such as processing element 50 in FIG. 1, would typically require a very fast digital signal processor (DSP) to perform the control loop functions in a time frame as short as 8 microseconds. Such high speed DSP's, if available at all, are likely to be high cost devices, as compared to standard off-the-shelf DSP's.

Figure 8:
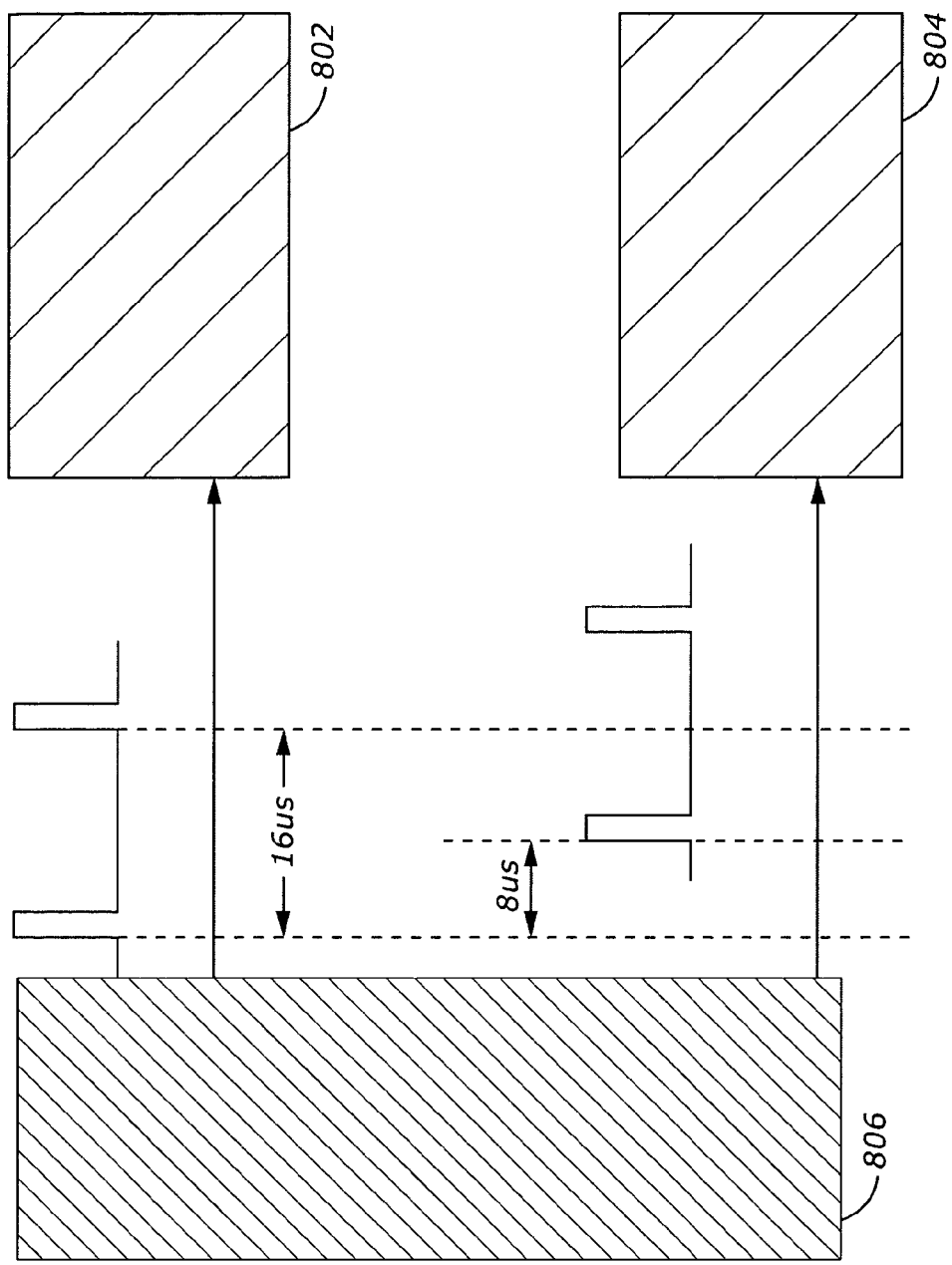
FIG. 8 is a block diagram of an exemplary DSP time slice structure.

To achieve the previously stated objectives of frequency scaling and low-cost production, a dual DSP configuration can be implemented with standard components. In this exemplary embodiment, as depicted in FIG. 8, two DSP modules 802, 804 are independently interrupted about every 16 microseconds, but with an 8 microsecond phase shift between the two interrupts. As such, each DSP 802, 804 can use up to 16 microseconds of process control time, while their respective output commands to the half-bridge assemblies 60 are synchronously time sliced to effect an 8 microsecond pulse-to-pulse interval. The interrupt signals can be generated by any appropriate type of system controller, such as a field programmable gate array (FPGA) 806, as shown in FIG. 8.

For the exemplary embodiment described above, as depicted in FIG. 8, standard off-the-shelf DSP modules are commercially available, such as, for example, the MKS2407 TMS32C2407 based motor control modules. As such, an exemplary dual DSP configuration can generate the 36 drive signals for the 18 half-bridge assemblies in a 6 times frequency scaled motor driver, and still achieve the desired torque loop control on a pulse-to-pulse basis.

Accordingly, the shortcomings of the prior art have been overcome by providing an improved controller/driver configuration for high frequency motor applications. Frequency scaling can be achieved by time-sharing the PWM output signals of multiple half-bridge assemblies connected to the respective phase windings of a motor. Each half-bridge assembly provides the desired current to a respective phase winding, but the half-bridge assembly switching elements each operate at a predetermined fraction of the total output PWM frequency. For example, an exemplary configuration of a 120 kHz PWM drive assembly would include six time-shared half-bridge assemblies for each phase winding, with each half-bridge assembly operating at 20 kHz. In addition, an overlapping dual DSP synchronized configuration can be used to process the torque loop control signals on a pulse-to-pulse basis. Moreover, the exemplary embodiment can achieve the above described frequency scaling and torque loop control with standard low-cost devices.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of frequency scaling a drive assembly having a plurality of half-bridge assemblies each configured to operate at a first frequency for controlling a motor with a predetermined number of phase windings, the method comprising the steps of:
   sequentially activating the plurality of the half bridge assemblies to generate a pulse-width-modulated output signal to a respective one of the phase windings at a second frequency greater than the first frequency;
   sampling the current in the respective phase windings on a pulse-to-pulse basis; and
   adjusting the output signal pulse width on a pulse-to-pulse basis to maintain a predetermined level of current in the phase windings.

2. The method of claim 1 wherein the second frequency is equal to the product of the first frequency and the number of half bridge assemblies connected to a respective phase winding.

3. A control system for driving a motor having a predetermined number of phase windings, comprising:
   a drive assembly in electrical communication with the phase windings of the motor, the drive assembly comprising a plurality of multiple half bridge assemblies, each multiple half bridge assembly having a plurality of individual half-bridge assemblies, with each individual half-bridge assembly having switching elements configured to operate at a first frequency; and a processor in electrical communication with the drive assembly, the processor configured to control the operation of the switching elements in the individual half-bridge assemblies on a pulse-to-pulse basis to thereby generate pulse-width-modulated signals into a respective phase winding at a second frequency that is higher than the first frequency.

4. The control system of claim 3 wherein the second frequency is equal to the product of the first frequency and the number of individual half-bridge assemblies in a multiple half-bridge assembly electrically connected to a respective phase winding.

5. The control system of claim 3 wherein the processor comprises a plurality of digital signal processor elements configured to output control signals to the individual half-bridge assemblies on a pulse-to-pulse basis.

6. The control system of claim 5 wherein the digital signal processor elements are independently interrupted in an overlapping manner, such that the output control signal frequency is greater than the processing frequency of a single one of the digital signal processor elements.

7. The control system of claim 6 wherein the output control signal frequency is the product of the number of independently interrupted digital signal processor elements and the processing frequency of a single one of the digital signal processor elements.

8. The control system of claim 3 wherein the switching elements comprise insulated gate bipolar transistors (IGBT's).

9. The control system of claim 7 wherein the digital signal processor elements comprise motor control modules MKS2407 TMS32C2407.

10. A motor comprising:

a plurality of phase windings;

a drive assembly comprising a plurality of multiple half-bridge assemblies each in electrical communication with one of the plurality of phase windings and having a plurality of individual half-bridge assemblies, with each individual half-bridge assembly comprising at least one switching element configured to operate at a first frequency; and a processor in electrical communication with each of the switching elements of the drive assembly, the processor configured to control the operation of the switching elements in the individual half-bridge assemblies to thereby provide signals to each phase winding at a second frequency that is greater than the first frequency.

11. The motor of claim 10 wherein the processor is further configured to control the operation of the switching elements on a pulse-to-pulse basis.

* * * * *